United States Patent [19]

Carter et al.

[11] Patent Number: 5,130,105
[45] Date of Patent: Jul. 14, 1992

[54] PROTEIN CRYSTAL GROWTH TRAY ASSEMBLY

[75] Inventors: Daniel C. Carter, Huntsville; Teresa Y. Miller, Falkville, both of Ala.

[73] Assignee: The United States of America as represented by the Administrator of the National Aeronautics and Space Administration, Washington, D.C.

[21] Appl. No.: 601,954

[22] Filed: Oct. 23, 1990

[51] Int. Cl.[5] .................. B01D 9/00; C30B 29/54; C30B 35/00
[52] U.S. Cl. .................. 422/245; 422/254; 422/56; 422/99; 422/102; 156/600; 156/621; 156/DIG. 62; 156/DIG. 113
[58] Field of Search .......... 156/DIG. 62, DIG. 113, 156/600, 621; 422/245, 254, 56, 99, 102; 118/719, 726, 729

[56] References Cited

U.S. PATENT DOCUMENTS

| | | | |
|---|---|---|---|
| 3,649,464 | 3/1972 | Freeman | 195/140 |
| 4,154,795 | 5/1979 | Thorne | 422/99 |
| 4,886,646 | 12/1989 | Carter et al. | 156/DIG. 62 |
| 4,917,707 | 4/1990 | Clara Monte et al. | 156/DIG. 113 |
| 4,919,899 | 4/1990 | Herrmann et al. | 422/245 |

*Primary Examiner*—Gary P. Straub
*Attorney, Agent, or Firm*—Robert L. Broad, Jr.; John R. Manning; Guy Miller

[57] ABSTRACT

A protein crystal growth tray assembly includes a tray that has a plurality of individual crystal growth chambers. Each chamber has a movable pedestal which carries a protein crystal growth compartment at an upper end. The several pedestals for each tray assembly are ganged together for concurrent movement so that the solutions in the various pedestal growth compartments can be separated from the solutions in the tray's growth chambers until the experiment is to be activated.

5 Claims, 2 Drawing Sheets

PROTEIN CRYSTAL GROWTH TRAY ASSEMBLY

ORIGIN OF THE INVENTION

The invention described herein was made by employees of the United States Government and may be manufactured and used by or for the Government for governmental purposes without the payment of any royalties thereon or therefor.

FIELD OF THE INVENTION

The present invention is directed generally to a protein crystal growth tray assembly. More particularly, the present invention is directed to a vapor diffusion protein crystal growth tray assembly. Most specifically, the present invention is directed to a compact vapor diffusion protein crystal growth tray assembly for protein crystal growth in a microgravity environment. A protein/precipitant solution is placed in a crystal growth compartment in each one of a plurality of ganged pedestals. Each pedestal is positioned in the center of an annular chamber which carries a wick that has been provided with a particular concentration of the precipitant solution. In use, the ganged pedestals are lowered to thereby separate the growth compartments from suitable seals so that protein crystal growth can occur. At the conclusion of the growth period, the pedestals are again sealed to terminate crystal growth.

DESCRIPTION OF THE PRIOR ART

One of the many experiments being conducted on various flights of the space shuttle is the growth of various crystals. Since these experiments are conducted in a microgravity environment, the growth of the crystals is not altered by the forces of gravity. Numerous such crystal growth experiments have been conducted and will continue to be carried on in future flights. Even though the flights of the space shuttles have become more frequent, there continue to be numerous experiments to be conducted by personnel who may not be intimately familiar with each procedure. Thus there is a requirement that the various experiments to be performed must be packaged and set up so that they can be done in a expeditious, space efficient manner by the personnel of the shuttle.

Protein crystal growth experiments are ones which are often carried out in the microgravity environment of space. In the past, these experiments have been set up and carried out using various configurations of apparatus, most of which have tended to be overly large and complicated. With storage area being at a premium on the space shuttle vehicles, and with the shuttle crews being called on to conduct a number of tasks, a large, complex protein crystal growth assembly is apt to be operated ineffectively.

Each prior art protein crystal growth experiment assembly has been essentially custom made by the individual investigator. Clearly such custom building requires a substantial amount of time and is apt to result in the creation of elaborate and expensive prototypes. Again, these various prototypes often tend to be difficult to load, operate and store.

Once the experimental assembly has been transported into space and the experiment or experiments have been conducted, the results must be returned to earth for analysis. The prior prototype assemblies often used have made it difficult to retrieve and to transport the protein crystals after they have been grown. Clearly, the crystals must be carefully stored and returned to the investigator for the experiment to have any useable results. With the prior devices this has often not been the case.

In a number of earlier protein crystal growth devices it has been necessary to use a syringe to add precipitant or protein droplets to the experimental chamber. These syringes are apt to add a contaminant, typically silicon grease to the experimental environment. Also, the need to use syringe assemblies further adds to the complexity of conducting the experiment thus further encumbering the shuttle crew.

It will thus be apparent that a need exists for a protein crystal growth tray assembly which overcomes the limitations of the prior art devices. The protein crystal growth tray assembly of the present invention provides such a device and is significant improvement over the prior art devices.

SUMMARY OF THE INVENTION

It is an object of the present invention to provide a protein crystal growth tray assembly.

Another object of the present invention is to provide a vapor diffusion protein crystal growth tray assembly.

A further object of the present invention is to provide a protein crystal growth tray assembly for crystal growth in micro-gravity.

Yet another object of the present invention is to provide a protein crystal growth tray assembly that is easy to transport and store.

Still a further object of the present invention is to provide a protein crystal growth tray assembly that uses few moving parts.

Even yet another object of the present invention is to provide a protein crystal growth tray assembly which provides a clean, contaminant free experiment.

An even further object of the present invention is to provide a protein crystal growth tray assembly which facilitates the simple retrieval and transport of samples after the completion of the experiment.

As will be discussed in detail in the description of the preferred embodiment which is set forth subsequently, the protein crystal growth tray assembly of the present invention utilizes a tray assembly that has a plurality of growth chambers. Each such chamber receives a central slidable pedestal that has a growth compartment, and each chamber includes an annular reservoir which carries a precipitant solution retaining wick. All of the pedestals in the tray are ganged together for movement toward or away from a sealant tape which overlies the top of the tray. The tray assembly is also provided with a cover that provides additional containment for the experiment and also reinforces the tape sealant.

The protein crystal growth tray assembly of the present invention duplicates the growth conditions of a widely accepted ground based technique which is commonly referred to as the "hanging-drop method". Thus it does not advocate or suggest a new or untried growth procedure. The use of this crystal growth tray assembly effectively standardizes the crystal growth procedure so that various investigators can supply their experiments in a uniform assembly. This will eliminate expensive and complex prototypes and will allow more effective storage of the device, as well as better utilization of crew time.

The protein crystal growth tray assembly of the present invention is quite simple to use and has very few moving parts. It is not necessary to use a syringe and thus removes that source of possible contamination from the experiments. Also, the elimination of the need to use a syringe renders the assembly easier to be used by relatively untrained personnel.

Once the pedestals have been lowered to expose the protein/precipitant solution in each pedestal compartment to the precipitant vapor in the chamber surrounding it, the experiment will start. To stop the experiment, it is necessary only to raise the pedestals back up against the sealant tape to isolate the crystal growth compartment from the surrounding chamber. The crystals grown during the experiment are safely retained in each pedestal compartment for their return to the person who submitted the experiment. Once the tray has been returned, the crystals in an individual compartment can be obtained by removing the top plate assembly and cutting through the sealant tape without disturbing the contents of adjacent chambers.

The protein crystal growth tray assembly in accordance with the present invention is far superior to the prior art devices and represents a significant advance in the art.

BRIEF DESCRIPTION OF THE DRAWINGS

While the novel features of the protein crystal growth tray assembly in accordance with the present invention are set forth with particularity in the appended claims, a full and complete understanding of the invention may be had by referring to the description of the preferred embodiment which is set forth subsequently and as illustrated in the accompanying drawings, in which:

DESCRIPTION OF THE PREFERRED EMBODIMENT

Figure 1:
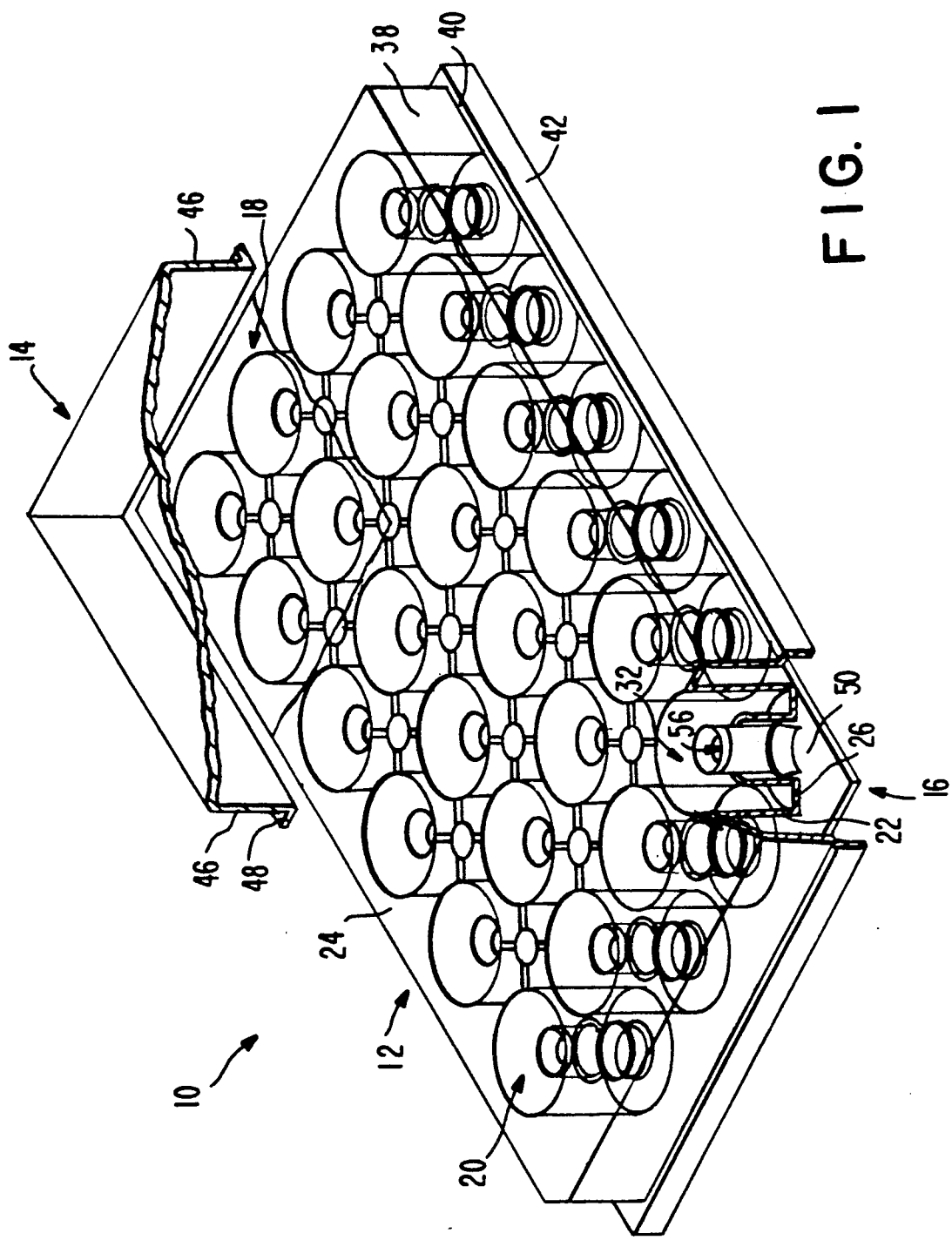
FIG. 1 is an exploded perspective view, partly in section, and showing the protein crystal growth tray assembly of the present invention.

Referring initially to FIG.. 1, there may be seen, generally at 10, a preferred embodiment of a compact vapor diffusion protein crystal growth tray assembly in accordance with the present invention. Tray assembly 10 includes a tray 12, an overlying cover 14, a plurality of moveable ganged pedestals 16, and a tape sealant 18. The tray 12 includes a plurality of individual crystal growth chambers 20 with each said chamber 20 receiving one pedestal of the ganged pedestal assembly 16 and with each such growth chamber 20 being overlaid by the tape sealant 18 and the tray cover 14.

Tray 12 is, in the preferred embodiment, fabricated using a transparent polycarbonate material and is 12 cm long, 8 cm wide and 2 cm in depth. There are provided twenty-four of the individual crystal growth chambers 20 with each such chamber 20 having a generally cylindrical outer wall 22 which extends downwardly from an upper or top planar surface 24 of tray 12, as may be seen in both FIGS. 1 and 2. Each cylindrical outer side wall 22 of each chamber 20 terminates in a generally horizontal bottom 26 that is generally in the shape of an annulus. An inner chamber wall 28 is concentric with outer chamber wall 22 and extends upwardly from chamber bottom 26. The inner chamber wall 28 for each crystal growth chamber 20 defines a central passage 30 through which a pedestal, generally at 32, which is one of the pedestals which comprises the ganged pedestal assembly 16, passes. This cooperation between each crystal growth chamber 20 and each pedestal 32 will be discussed shortly.

The outer side wall 22, bottom 26, and inner side wall 28 of each growth chamber define an annular space 34. A suitable annular or donut-shaped wick 36 of a porous material, such as a high molecular weight polyethylene, fits into the annular space 34 to contain a suitable precipitant solution and to provide adequate surface area for the vapor equilibration process to occur during the growth of the protein crystals. It is to be noted that the height of the inner growth chamber wall 28 is less than the height of the outer growth chamber wall 22.

Returning again to FIG. 1, tray 12, in addition to the top surface 24, has downwardly extending side walls 38 which end in a lower circumscribing flange 40. This lower flange 40, in turn has a downwardly directed web 42 which provides a reinforcing base for the tray 12. The tray cover 14 is shaped to snugly fit over the tray 12 and also has a generally planar top 44, downwardly depending side walls 46 and an outwardly projecting lip 48. In use, cover 14 may be placed atop tray 12 so that the cover lip 48 will rest on the tray flange 40. Suitable fastening clips or other fastening devices (not shown) may be used to secure the cover 14 to the tray 12. Alternatively, tray cover 14 may be generally planar so that it will overlie the top surface 24 of tray 12. This alternatively configured cover 14 may be provided with a peripheral seal. Which will engage the tray top surface 24.

Figure 2:
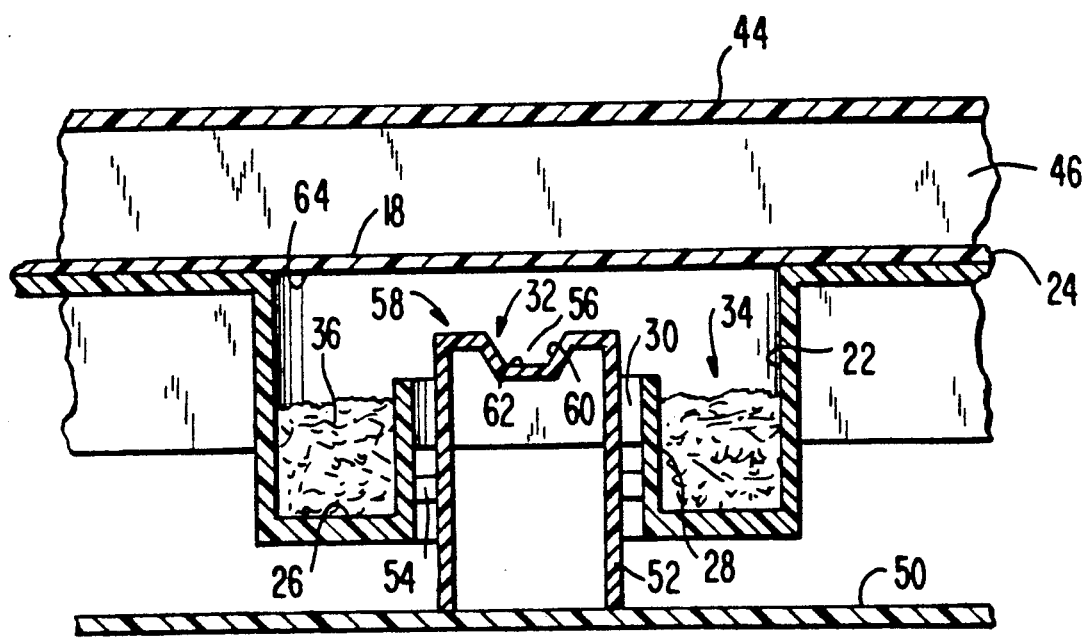
FIG. 2 is a side elevation view, partly in section and showing one chamber of the protein crystal growth tray assembly.

Ganged pedestal assembly, generally at 16, includes, as may be seen in FIGS. 1 and 2, a lower pedestal support plate 50 and a plurality of spaced, upwardly extending ones of the pedestals 32. It will be understood that the spacing of the pedestals 32 on the pedestal support plate 50 corresponds with the spacing of the central pedestal passages 30 in each of the crystal growth chambers 20. It will further be understood that the dimensions of the pedestal support plate 50 will be less than the size of the open bottom of tray 12. This will ensure that the pedestal support plate 50 can be moved vertically to elevate and retract the pedestals 32 in the protein crystal growth chambers 20. While pedestal support plate 50 is depicted in FIGS. 1 and 2 as a one piece member, it would be possible to use alternative pedestal support means so that the pedestals 32 in less than all of the growth chambers 20 could be elevated or retracted.

Each pedestal 32, as may be seen most clearly in FIG. 2, has a generally cylindrical side wall 52 whose outer diameter is less than the inner diameter of the inner side wall 28 of each crystal growth chamber 20. A suitable O-ring seal 54 is secured to the inner surface of the growth chamber inner side wall 28 to provide a sliding seal between the pedestal side wall 52 and the growth chamber inner side wall 28.

A protein crystal growth compartment 56 is formed in an upper surface 58 of each pedestal 32. In the preferred embodiment, each such crystal growth compartment 56 has a depth of generally about 3 mm and an ID of generally about 5 mm. As may be seen in FIG. 2, each such crystal growth compartment 56 is preferably generally shaped as an inverted truncated cone which has inwardly and downwardly surface 62.

Tape sealant 18 is, in the preferred embodiment, sized to completely overlie the top surface 24 of tray 12. Tape sealant 18 is preferably a clear, polypropylene tape that has a suitable adhesive on its undersurface 64. It will be readily apparent that the adhesive used on tape sealant 18 must not be affected by, or have any effect on, the protein/precipitant being used in the protein crystal growth tray assembly 10.

The height of the individual pedestals 32 is selected, with respect to the height of the outer side walls 22 of the crystal growth chambers 20, to allow the pedestals 32 to be able to travel upwardly until each pedestal's upper surface 58 sealingly engages the undersurface 64 of the tape sealant 18. Further upward movement of the pedestals 32 may be restricted by an abutting engagement between the pedestal support plate 50 and the lower surface of the bottom 26 of the growth chamber 20.

In use, a suitable volume of a selected precipitant solution is placed in the annular space 34 in each growth chamber 20 and is absorbed by the porous wick 36. A suitable protein/precipitant solution is placed in the protein crystal growth compartment 56 on the upper surface 58 of the pedestal 32. In the preferred embodiment, the crystal growth compartment 56 can accommodate about 0.1 ml of solution. The upper surface 58 of each pedestal 32 is then brought into sealing engagement with the undersurface 64 of tape sealant 18. This will isolate the growth compartment 56 from the growth chamber 20. The tape sealant 18, together with each O-ring 54, also separates the annular space 34 in each crystal growth chamber 20 from the surrounding chambers and the ambient atmosphere.

Once the protein/precipitant solution has been placed in growth component 56 and the precipitant has been absorbed by wick 36 in the chamber 20, the solutions are separated by elevation of the pedestals 32 into contact with the tape sealant 18. The cover 14 may then be put in place atop the tray 12 and the assembly can then be fastened shut. The completed protein crystal growth tray assembly 10 may then be subjected to a temperature of generally about 60° C. to 150° C. and may be maintained at this temperature until such time as the experiment is to be activated. This is accomplished by allowing the solutions to thaw and by then lowering the ganged pedestal plate assembly 18 to separate the upper surface 58 of each pedestal 32 from the tape sealant 18. Vapor diffusion crystal growth can then take place until the experiment is de-activated by using the pedestal support plate 50 to again raise the pedestals 32 until their upper surfaces 58 sealingly engage the tape sealant 18. The tray assembly 10 can then be sealed for return to earth with the crystals that have been grown being contained in the sealed protein crystal growth compartments 56. If desired, individual experiments contained in each crystal growth chamber 20 can be removed separately by taking off cover 14 and by simply cutting through the tape sealant 18 overlying each growth compartment 20. The grown crystals can then be removed from the selected pedestal's protein crystal growth compartment 56 while leaving the experiments in the other growth chambers 20 undisturbed.

In experiments where the freezing process would have a negative effect on the solutions, the protein/precipitant solution in the compartment 56 of each pedestal can be kept separated from the precipitant in the wick 36 by se of the tape sealant 18. Alternatively, the tape sealant 18 could be dispensed with and a suitable O-ring seal (not specifically shown) for each pedestal compartment 56 could be provided in the top surface 44 of the tray cover 14. Elevation of the individual pedestals 32 by use of the pedestal support plate 50 would then bring each pedestal upper surface 58 into sealing engagement with the O-ring in the cover top 44. In this configuration, experiment activation would proceed by using the ganging plate 50 to retract the pedestals 32 from the tray cover seals. This again allows vapor communication between the solution in the pedestal protein crystal growth compartment 56 and the solution in the wick 36 and initiates the crystallization process. Deactivation of the experiment is accomplished by raising the pedestals 32 back up into contact with the cover 14.

While a preferred embodiment of a protein crystal growth tray assembly in accordance with the present invention has been set forth fully and completely hereinabove, it will be apparent to one of skill in the art that a number of changes in, for individual crystal growth chambers, the particular tape sealant used and the like may be made without departing from the true spirit and scope of the present invention which is accordingly limited by the following claims.

What is claimed is:

1. A protein crystal growth apparatus useable in the vapor diffusion growth of protein crystals, comprising
  a. a first cylindrical wall having a first diameter,
  b. a second cylindrical wall positioned inside the first wall and having a second diameter, said second diameter being less than said first diameter to form an annular chamber between said walls, said second wall being shorter than said first wall and defining a central passageway therethrough,
  c. an annular floor extending from the first wall to the second wall to form a floor for the chamber,
  d. a pedestal extending upwardly through said central passageway and having in the upper surface thereof a recess for serving as a protein crystal growth area, and
  e. an adhesive sheet covering the open upper end of the first wall, said pedestal being moveable upward through said central passageway into contact with the adhesive sheet to isolate said recess form said annular chamber.

2. The apparatus of claim 1 wherein the annular chamber contains a porous wick for holding a precipitant solution.

3. The apparatus of claim 1 wherein the first cylindrical wall depends from a tray and the pedestal is supported by a plate.

4. The 1 of claim 3 wherein the tray is provided with a plurality of said first cylindrical walls and the plate supports a plurality of said pedestals, said pedestals being aligned with and positioned in said central passageways.

5. The apparatus of claim 4 wherein an O-ring positioned between the pedestal and said second wall seals the apparatus against loss of said precipitant solution.

* * * * *